United States Patent [19]
Tanoue et al.

[11] Patent Number: 5,598,015
[45] Date of Patent: Jan. 28, 1997

[54] HETERO-JUNCTION BIPOLAR TRANSISTOR AND SEMICONDUCTOR DEVICES USING THE SAME

[75] Inventors: Tomonori Tanoue, Machida; Hiroshi Masuda, Kodaira, both of Japan; Tohru Nakamura, San Diego, Calif.; Takahiro Onai, Ome; Katsuyoshi Washio, Tokorozawa, both of Japan

[73] Assignee: Hitachi, Ltd., Tokyo, Japan

[21] Appl. No.: 357,342

[22] Filed: Dec. 15, 1994

Related U.S. Application Data

[63] Continuation of Ser. No. 123,070, Sep. 17, 1993, abandoned.

[30] Foreign Application Priority Data

Sep. 18, 1992 [JP] Japan ................... 4-249192

[51] Int. Cl.$^6$ ............ H01L 31/0328; H01L 31/0336; H01L 27/082
[52] U.S. Cl. ................ 257/197; 257/198; 257/588
[58] Field of Search ............... 257/197, 198, 257/587, 588, 592, 586

[56] References Cited

U.S. PATENT DOCUMENTS

| | | | |
|---|---|---|---|
| 4,768,074 | 8/1988 | Yoshida et al. | 257/198 |
| 4,868,418 | 8/1989 | Imamura et al. | 257/198 |
| 4,903,104 | 2/1990 | Kawai et al. | 257/198 |
| 4,979,009 | 12/1990 | Kusano et al. | 257/198 |
| 5,017,517 | 5/1991 | Mochizuki et al. | 257/200 |
| 5,099,299 | 3/1992 | Fang | 257/197 |
| 5,296,733 | 3/1994 | Kusano et al. | 257/586 |

FOREIGN PATENT DOCUMENTS

| | | | |
|---|---|---|---|
| 1-57665 | 3/1989 | Japan | 257/197 |
| 1251661 | 6/1989 | Japan | 257/197 |
| 3-270271 | 12/1991 | Japan | 257/198 |

OTHER PUBLICATIONS

"Double Heterojunction GaAs–GaAlAs Bipolar Hamsistors Grown by MOCVD For Emitter Coupled Logic"; Dubon et al, IEEE 1983; IEDM pp. 689–693.
Boylestad et al.—"Electronic Devices and Circuit Theory," 1982; p. 586.

Primary Examiner—Wael Fahmy
Attorney, Agent, or Firm—Antonelli, Terry, Stout & Kraus LLP

[57] ABSTRACT

A hetero-junction bipolar transistor having an emitter composed of a semiconductor having a wider forbidden band width than that of a semiconductor constituting a base is disclosed. In the transistor, the emitter and the electrode leader area composed of a single crystalline semiconductor are provided being extended from the upper part of the emitter to the surface of the base through an insulating layer, for the purpose of making it possible to miniaturize the transistor and to operate the transistor at a high-speed by decreasing the emitter resistance.

5 Claims, 14 Drawing Sheets

PLAN VIEW

A–A' CROSS SECTION

B–B' CROSS SECTION

PLAN VIEW

A-A' CROSS SECTION 5,598,015

HETERO-JUNCTION BIPOLAR TRANSISTOR AND SEMICONDUCTOR DEVICES USING THE SAME

This application is a continuation of application Ser. No. 08/123,070, filed Sep. 17, 1993, now abandoned.

BACKGROUND OF THE INVENTION

The present invention relates to hetero-junction bipolar transistors which are miniaturized and are able to perform high-speed operation and to semiconductor device using the same.

There are descriptions in Technical Report ED91-161 of IEICE and in IEEE Trans. Electron Devices, vol. ED-34, pp. 2246–2253 (1987), About conventional hetero-junction bipolar transistors.

In the case of a hetero-junction bipolar transistor described in the first document, the junction area of an emitter electrode and an emitter is approximately equal to that of the emitter and a base, and the junction area of the base and a collector is always larger than those of the above-mentioned junctions as shown in FIG. 26. Because of this, there has been a problem that an emitter resistance caused by the contact resistance of the emitter electrode is large and the capacitance between the collector and the base is large. In order to connect a wire to the smallest emitter electrode, the dimensions of a transistor are limited by those of the emitter and it has been difficult to realize a transistor having enough small dimensions.

Furthermore, in the case of a bipolar transistor described in the second document, an emitter electrode is formed on a polycrystalline semiconductor layer as shown in FIG. 27. There has been a problem that in the polycrystalline semiconductor the mobility of electrons is low and it is impossible to make the emitter resistance small sufficiently.

SUMMARY OF THE INVENTION

An object of the present invention is to provide a hetero-junction bipolar transistor having a small emitter resistance and an ability of high-speed operation and a semiconductor device using the transistors.

Another object of the present invention is to provide a miniaturized hetero-junction bipolar transistor and a semiconductor device using the transistors.

The above-mentioned objects can be achieved by constituting an emitter leadout electrode area with a single crystalline semiconductor.

Further the above-mentioned objects can be achieved by providing the emitter and the leadout electrode area of the emitter composed of a single crystalline semiconductor while extending them from the upper part of the emitter onto the surface of the base through an insulating layer.

These and other objects and many of the attendant advantages of the invention will be readily appreciated as the same becomes better understood by reference to the following detailed description when considered in connection with the accompanying drawings.

DETAILED DESCRIPTION OF THE INVENTION

The mobility of electrons can be upgraded by constituting an emitter layer and the leader electrode area therefrom with a single crystalline semiconductor; thereby, the emitter resistance can be decreased.

The junction area of the emitter electrode and the emitter can be made larger than the junction area of the emitter and the base by providing the emitter and the emitter leadout electrode area composed of a single crystalline semiconductor in a state that they are extended from the upper part of the emitter onto the base surface through an insulating layer. Thereby, the resistance caused by the junction with an electrode can be decreased.

Furthermore, the dimensions of the above-mentioned leadout electrode area can be decided independent of the emitter area, so that the emitter area can be made small, which makes it possible to miniaturize a transistor.

In the following, the present invention will be explained concretely with embodiments.

In the following explanation, a numeral 1 denotes a substrate, 2 denotes a sub-collector, 3 denotes a collector, 4 denotes a base, 5 denotes a surface protection layer, 6 denotes an emitter, 7 denotes a cap layer, 8 denotes a buried insulating layer, 9 denotes a surface insulating layer, 10 denotes a base leadout electrode, 11 denotes a collector electrode, 12 denotes an emitter electrode, 13 denotes a base electrode, 20 denotes a dummy emitter, 21 denotes an emitter side wall, 22 denotes a base leadout electrode, 23 denotes a first planing insulating layer, 24 denotes a second planing insulating layer, 25 denotes a side wall for separating the emitter from the base, 26 denotes a gas source cell, 27 denotes a metal-organic molecular beam epitaxial (MOMBE) crystal growth chamber, 28 denotes an etching chamber and 29 denotes a vacuum transfer mechanism.

Embodiment 1

A bipolar transistor being concerned with the embodiment 1 according to the present invention will be explained using FIGS. 1 to 10.

Figure 1:
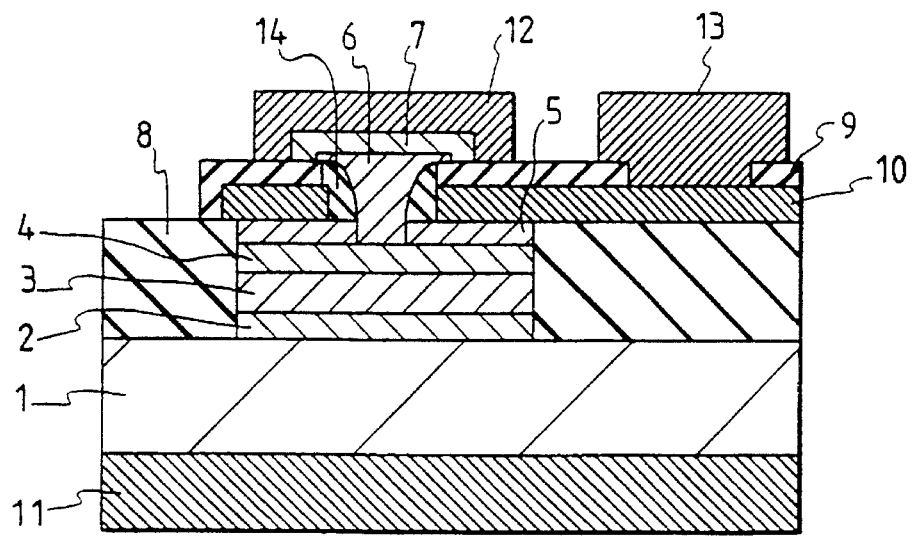
FIG. 1 shows a cross sectional view of a bipolar transistor being concerned with an embodiment 1 according to the present invention.

FIG. 1 is a cross sectional view of a bipolar transistor according to the present invention. In FIG. 1, a numeral 1 denotes a semiconductor substrate composed of n-type InP, 2 denotes a sub-collector composed of n-type InGaAs ($n=2\times10^{19}/cm^3$, thickness: 0.5 μm, In composition ratio: 0.53), 3 denotes a collector composed of n-type InGaAs ($n=2\times10^{16}/cm^3$, thickness: 0.3 μm, In composition ratio: 0.53), 4 denotes a base composed of p-type InGaAs ($p=4\times10^{19}/cm^3$, thickness: 0.05 μm, In composition ratio: 0.53), 5 denotes a base surface protection layer composed of p-type InP ($p=4\times10^{19}/cm^3$, thickness: 0.05 μm), 6 denotes an emitter composed of n-type InP ($n=1\times10^{18}/cm^3$, thickness: 0.5 μm), 7 denotes a cap layer composed of n-type InGaAs ($n=5\times10^{19}/cm^3$, thickness: 0.1 μm, In composition ratio: 0.53), 8 denotes a buried insulating layer composed of $SiO_2$ (thickness: 0.9 μm), 9 denotes an insulating layer for surface protection composed of $SiO_2$ (thickness: 0.2 μm), 10 denotes a base leadout electrode (WZn: Zn 0.1 mol %, thickness: 0.2 μm), 11, 12 and 13 denote respectively a collector, an emitter and a base electrodes.

Figure 2:
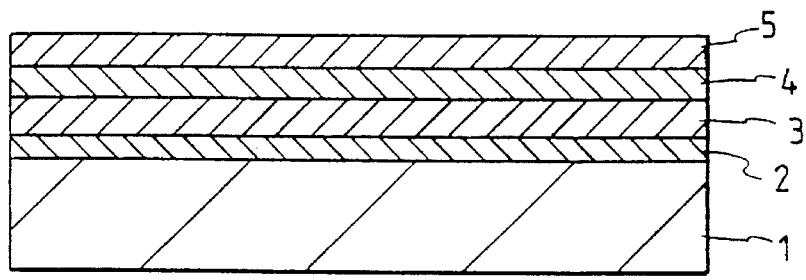
FIGS. 2 to 10 show cross sectional views of a device showing the production process of a bipolar transistor being concerned with the embodiment 1 according to the present invention.
Figure 3:
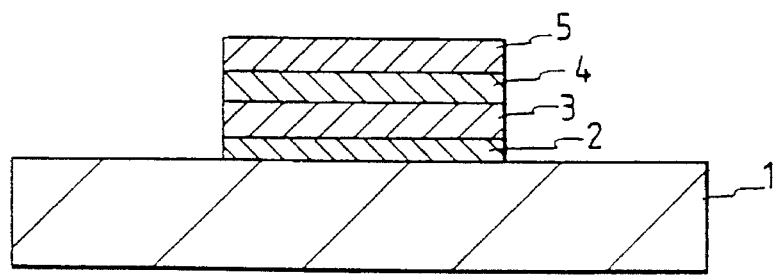

The production method of a semiconductor device having the constitution as described in the above will be explained using FIGS. 2 to 10. At first, as shown in FIG. 2, the sub-collector 2 composed of n-type InGaAs, the collector 3 composed of n-type InGaAs, the base 4 composed of p-type InGaAs and the base surface protection layer 5 composed of p-type InP are formed in order by crystal growth on the substrate 1 composed of n-type InP. The lattice matching between the InP substrate and other crystals is kept within ±1% for the prevention of crystal dislocation formation. An ordinary molecular beam epitaxy method (MBE method) or a metal-organic molecular beam epitaxy method (MOMBE method) are used for the growth of crystals. Si or Sn can be used as an n-type dopant and Be can be used as a p-type dopant. When Zn is used as a p-type dopant, of course, it is possible to perform deposition by MOCVD method, but in this case, in a later process, re-growth temperature is limited to below 600° C. for the suppression of diffusion of Zn. After the growth of crystals, the substrate is taken out from the growth device, and at least the surface protection layer 5 and the base layer 4 are removed excluding the transistor area by ordinary photolithography and chemical etching; thus the constitution as shown in FIG. 3 is obtained.

Figure 4:
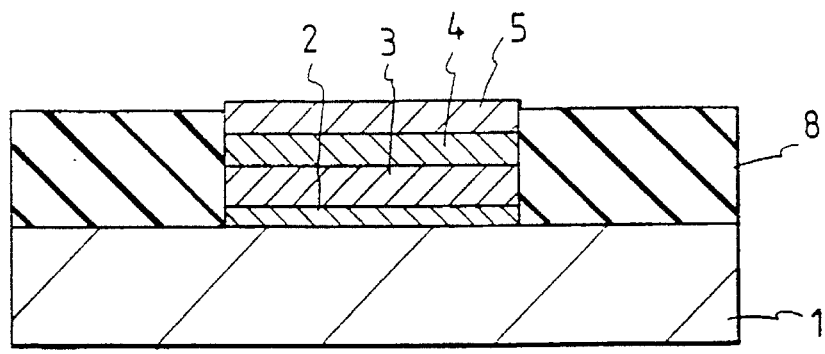
Figure 5:
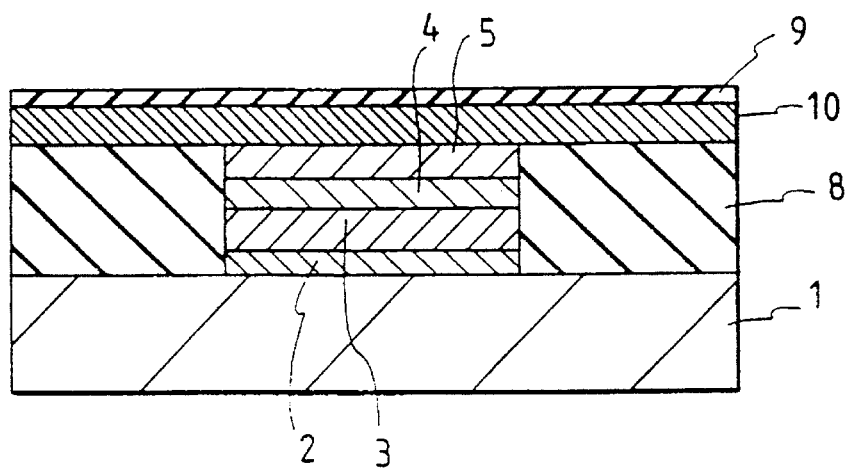
Figure 6:
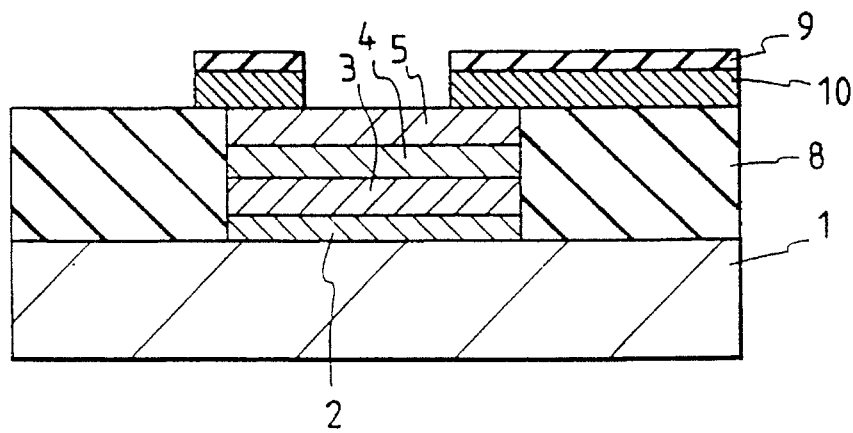

Next, the etched area is filled up with an insulating layer 8 and the constitution as shown in FIG. 4 is obtained. The filling up is performed as shown below: after the deposition of an insulating layer having a predetermined thickness, an organic material layer of about 2 μm thick is applied over it, and after it is planarized, the organic material layer and the insulating layer are etched with the same speed. Next, as shown in FIG. 5, the base leadout electrode 10 and the surface insulating layer 9 are deposited, and the laminated layer composed of the leadout electrode 10 and the surface insulating layer 9 is processed by ordinary photolithography and etching, and the shape as shown in FIG. 6 is obtained.

Figure 7:
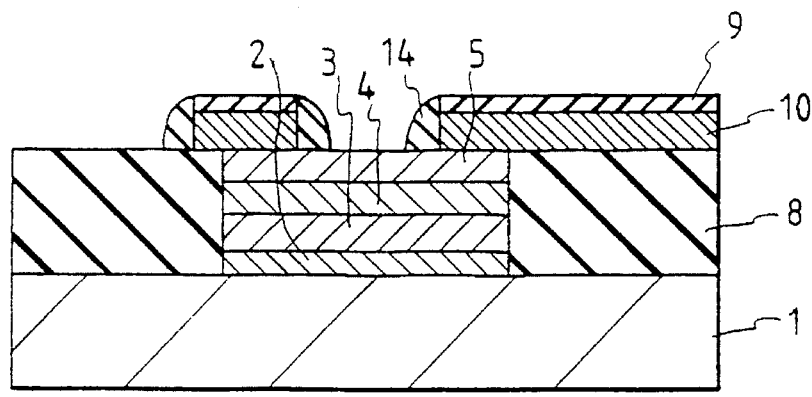

Next, an insulating layer is deposited again and a side wall insulating layer 14 is formed by anisotropic etching on the side surfaces of the laminated layer of the base leadout electrode 10 and the surface insulating layer 9, as shown in FIG. 7.

Figure 8:
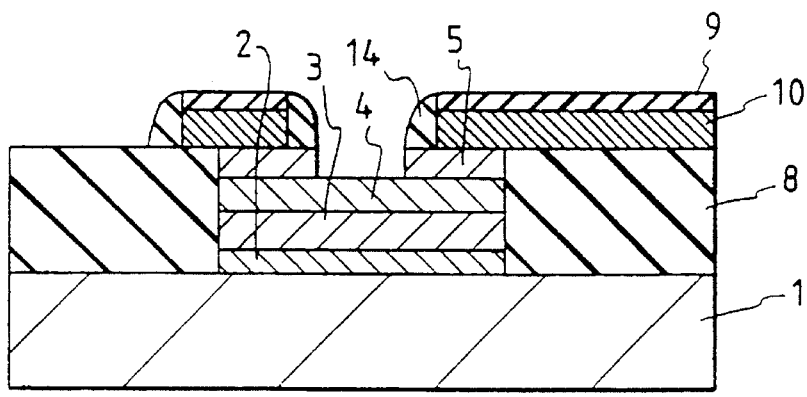
Figure 9:
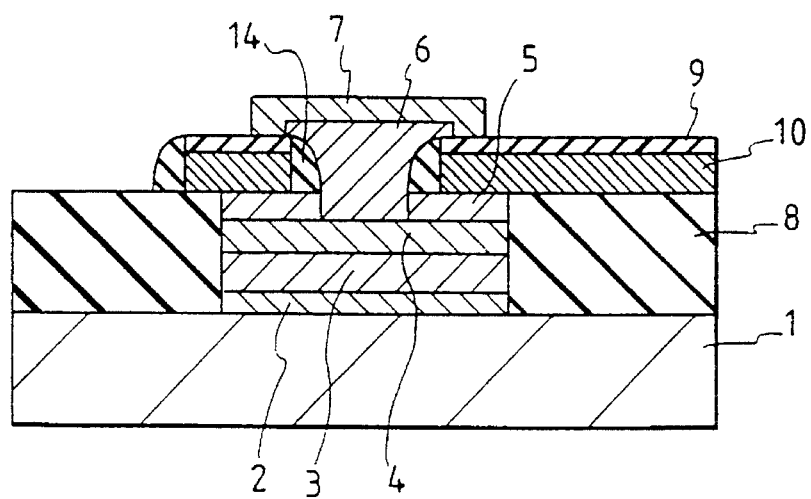
Figure 28A:
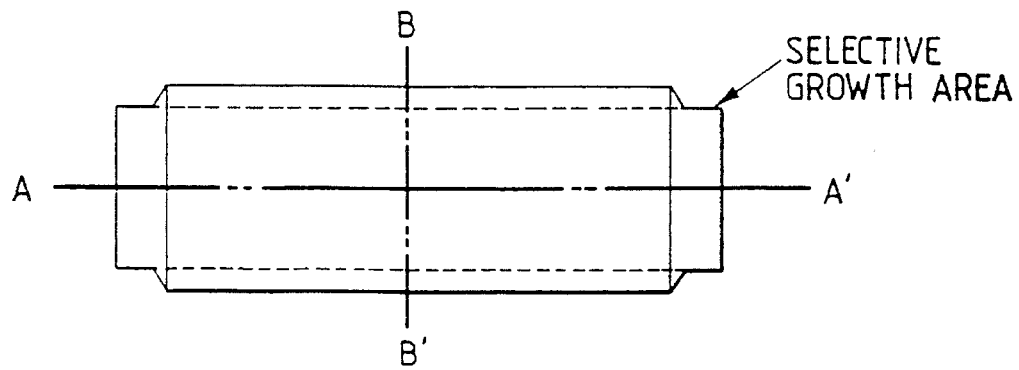
FIG. 28(a) shows a shape of an emitter formed by selective growth when it is assumed that the bearing of a substrate plane is (100).
Figure 28B:
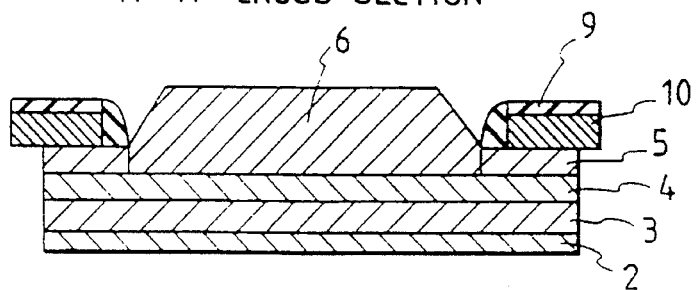
FIG. 28(b) shows a cross sectional view of the emitter shown in FIG. 28(a) taken on a line, A-A'.
Figure 28C:
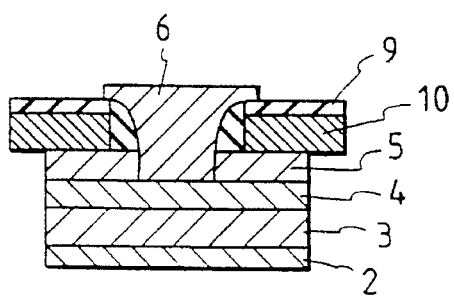
FIG. 28(c) shows a cross sectional view of the emitter shown in FIG. 28(a) taken on a line, B-B'.
Figure 29A:
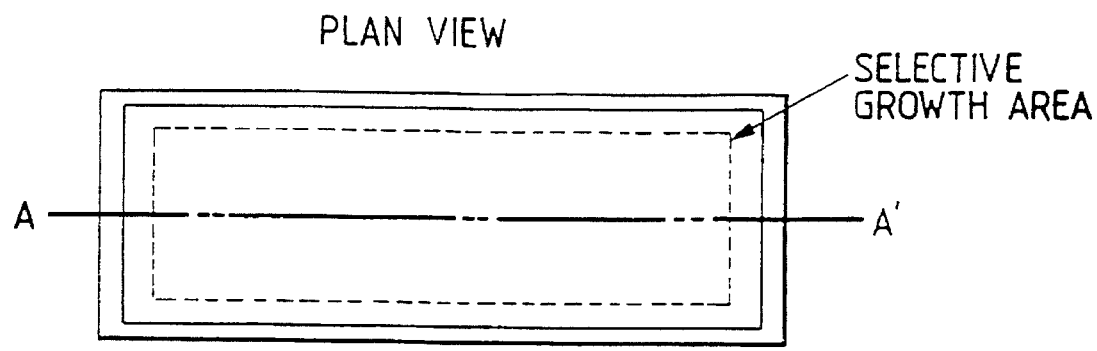
FIG. 29(a) shows a shape of an emitter formed by selective growth when it is assumed that the bearing of a substrate plane is (111).
Figure 29B:
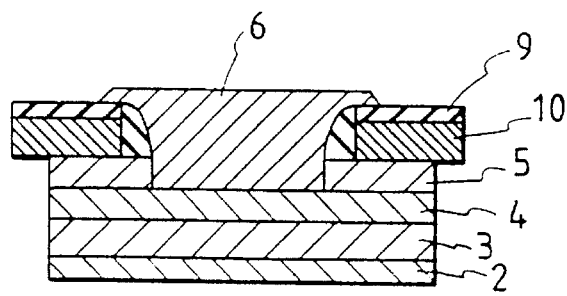
FIG. 29(b) shows a cross sectional view of the emitter shown in FIG. 29(a) taken on a line, A-A'.

Next, the surface protection layer 5 is removed using the above-mentioned side wall as a mask to expose the base 4, and a constitution as shown in FIG. 8 is obtained. The InP emitter 6 and the InGaAs cap 7 are made to grow selectively over the area where the base surface is exposed on the substrate with the MOMBE method, and a constitution as shown in FIG. 9 is obtained. The selective crystal growth can be performed as described below. At first a substrate having a constitution as shown in FIG. 8 is heated up to 580° C. in a MOMBE growth chamber to remove an oxide layer. In this case, the desorption of As from the surface can be prevented by irradiating the surface with an As molecular beam at a pressure of about $1\times10^{-3}$ Pa. After that, the temperature is lowered to a temperature range (350° C. to 500° C.), which is suitable for selective growth of crystals. Typical growth conditions are shown below: the pressure in the growth chamber is $10^{-2}$ to $10^{-3}$ Pa and the substrate temperature is 450° C. The supply quantities of material gases are, in the growth period of InP, 0.7 sccm of TEI and 10 sccm of $PH_3$, and in the growth period of InGaAs, 0.35 sccm of TEG, 0.4 sccm of TEI, and 0.8 sccm of $AsH_3$ where TEI is triethylindium and TEG is triethylgallium. As the substrate plane bearing, generally (100) is used and the shape as shown in FIG. 28 is obtained. When a plane (111)B or a plane (110) is used, a constitution is obtained as shown in FIG. 29.

Figure 10:
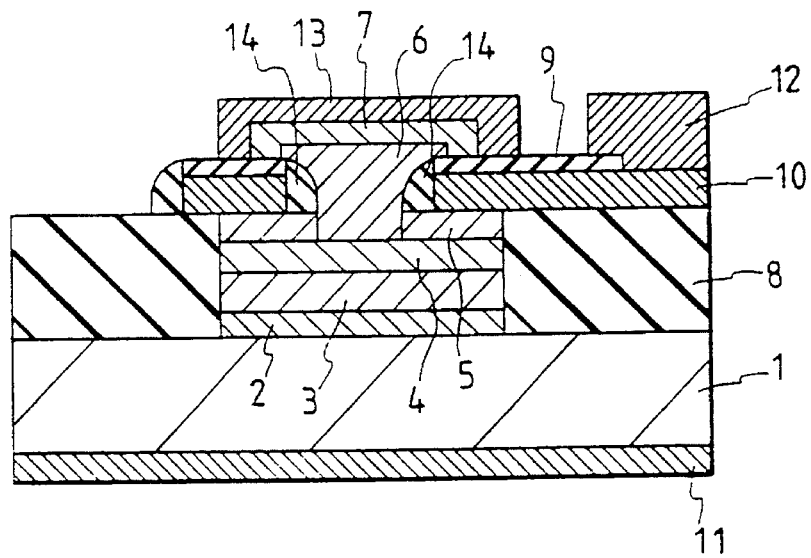

Dopant selection can be performed in a similar manner to the first crystal growth process. A surface oxide layer which lies on the exposed part of the base surface can be completely removed by a heating process in an As atmosphere at 520° C. for 5 min, and a clean surface can be obtained. By the heating process in the selective growth, Zn, contained in the base leadout electrode 10, is diffused into the surface protection layer, and an ohmic contact is formed between the electrode and the base. After that, electrodes are formed on the surface and the back of the substrate, and a constitution as shown in FIG. 10 is obtained.

After that, another insulating layer is provided on the electrodes and contact holes to be used for the connection with wirings are made, and then metallic wirings are fixed and processed to complete a transistor.

When a minimum feature size is assumed to be 0.8 μm, the dimensions of a transistor formed as described in the above are as shown in the following: the junction area between the emitter and the base is $1\times3.5$ μm$^2$, and that between the base and the collector is 2.5×5 μm². In the case of a conventional semiconductor device in the first conventional example manufactured with the same processing dimension rule, the junction area between the emitter and the base is 2.5×5 μm² and that between the base and the collector is 5×12 μm². The causes which bring about such differences are as mentioned below. At first, according to the above-mentioned rule, the minimum dimensions of an electrode is three times of the minimum feature size. This is decided with the sum of the size of a contact hole for connecting a wire and the alignment tolerance on both sides. In the present embodiment, owing to the difference in the emitter's shape, the emitter junction area can be made smaller than the area of the emitter electrode, so that the miniaturization of the emitter junction is made possible. Further, the junction area of the base and the collector is larger than the junction area of the base and the emitter, but in the present invention, the junction area of the base and the collector can be made smaller than the area of the leadout portion of the base electrode, so that the junction area can be made to a minimum necessary size. On the contrary, in the case of a conventional type, if it is intended to adopt the same base leadout constitution as that in the present embodiment, the constitution of the emitter electrode becomes a complicated one, which hinders the miniaturization of the electrode and brings about the above-mentioned difference.

Owing to the effect of the miniaturization of the emitter junction, the current which makes a cutoff frequency maximum is 4 mA in the case of the present embodiment and in the case of a conventional constitution the current is 14 mA, and in both cases cutoff frequency is 80 GHz. According to the present invention, a transistor of low power consumption and high performance can be obtained. In the case of a transistor according to the present invention, the capacitance between the base and the collector is about 5 femtofarad, and in the case of a conventional case, it is about 24 femtofarad, a value close to five times of the former value. Because of this, the maximum oscillation frequency, in the case of the present invention, is 125 GHz, and that in the case of a conventional constitution is about 56 GHz; the upgrade of about 2.2 times can be obtained.

In the present embodiment, a transistor of low power consumption and high performance can be obtained.

Embodiment 2

In the present embodiment, a GaAs substrate is used in place of an InP substrate used in the embodiment 1, and GaAs is used in place of InGaAs for the base and the collector, and AlGaAs is used in place of InP for the emitter and the surface protection layer. The growth of crystals is performed with a low pressure MOCVD method, and as a p-type dopant C is used in place of Be. A layer in which the composition is gradually changed from AlGaAs to InGaAs is inserted between the emitter and the cap. In the period of selective growth, a heating process at 600° C. for 5 min. in the As atmosphere is needed for the surface cleaning.

Typical crystal growth conditions are as described below: the substrate temperature is 580° C. the pressure in a growth period is 10 kPa, TMG flow rate is 5 sccm, AsH₃ flow rate is 100 sccm and TMA flow rate (in the period of growth of AlGaAs) is 3 sccm where TMG is trimethylgallium and TMA is trimethylaluminum. Under the flow rate conditions described in the above, the temperature of the substrate in which selective growth is possible is in the range of 550° C. to 700° C. If the flow rates are decreased, selective growth is made possible in the lower temperature, but in that case the growth rate is remarkably lowered and productivity is much lowered, therefore the temperature range as mentioned in the above is desirable.

About the substrate plane bearing and the shapes of grown crystals, almost the same results can be obtained as those obtained in the preceding embodiment.

The dimensions of a transistor are the same as those in the embodiment 1, and it shows the performance that the current at which the cutoff frequency becomes maximum is 2.5 mA and the maximum oscillation frequency is 100 GHz. In the case of a conventional constitution, the corresponding values of the current and the frequency are 8 mA and 45 GHz respectively. The upgrade of approximately the same order as that obtained in the embodiment 1 can be obtained.

The materials used in the embodiments 1 and 2 are not limited to those described in the above. When a transistor having the same shape is formed with a semiconductor composed of other compounds of groups, III–V, and their mixed crystals, or with a semiconductor composed of other compounds of groups, II–IV, and their mixed crystals, the upgrade of the same order in comparison with the case of a conventional constitution can be obtained as that obtained in the above embodiment. When a transistor of the same constitution as described in the above is manufactured with Si, the emitter resistance can be decreased in comparison with a case where the emitter electrode is formed with poly-Si.

Embodiment 3

In the production process to be performed in the embodiment 2, a hetero-junction compound semiconductor is manufactured while omitting the accumulation of a surface protection layer. Since there is no protection layer, the electrons injected into the base make recombination on the interface between the leadout electrode 10 and the base, and the current amplification factor is lowered to 30 from 100. On the other hand, the contact resistance caused by the hetero-junction between the surface protection layer and the base is decreased and the base resistance is decreased by ten percent. As a result, the maximum oscillation frequency of 105 GHz is obtained.

Embodiment 4

Figure 30:
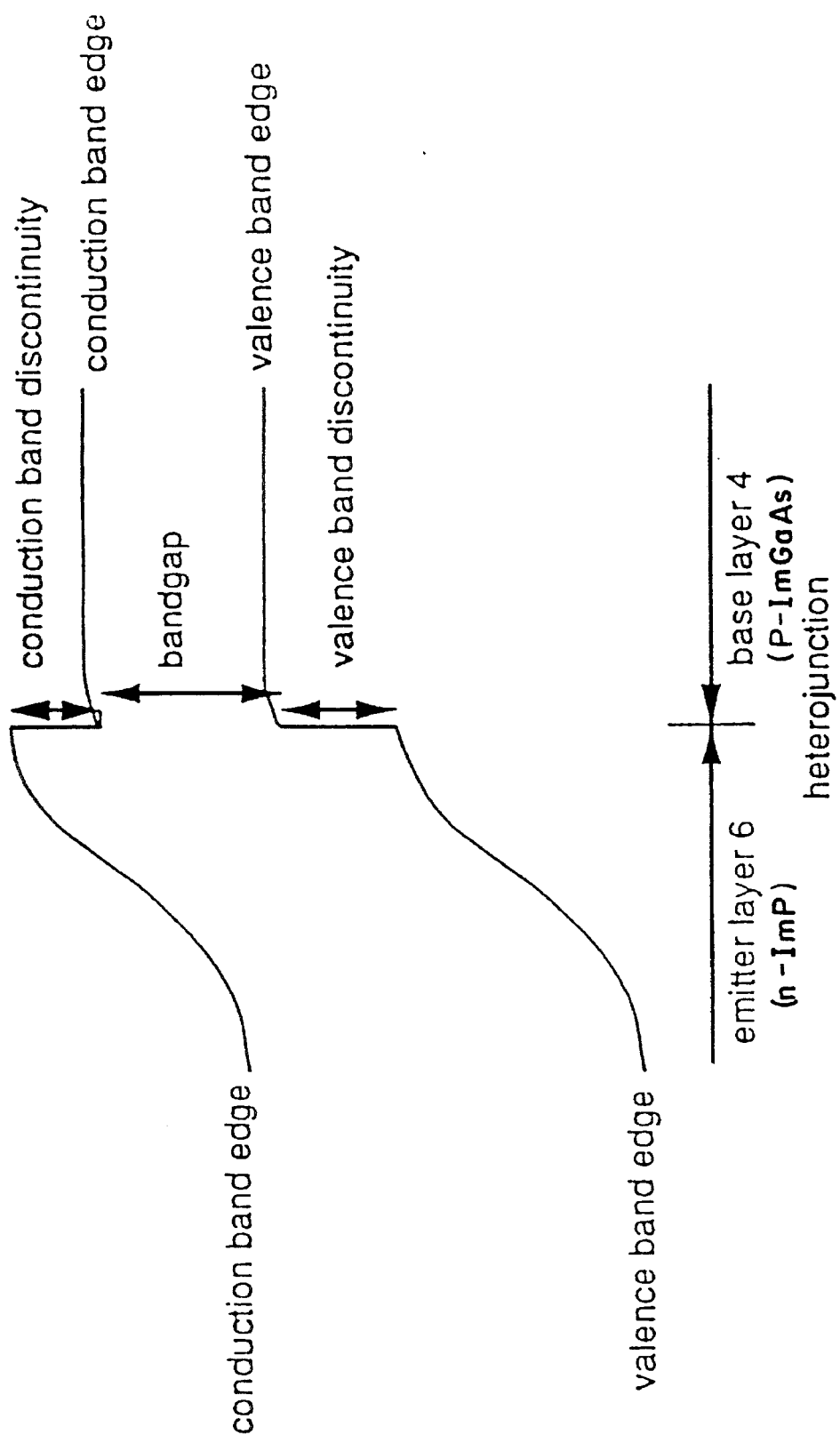
FIG. 30(a) is an energy band diagram for an n-InP and p-InGaAs heterojunction.
FIG. 30(b) is an energy band diagram for a p-InAlAs and p-InGaAs heterojunction.
Figure 30:
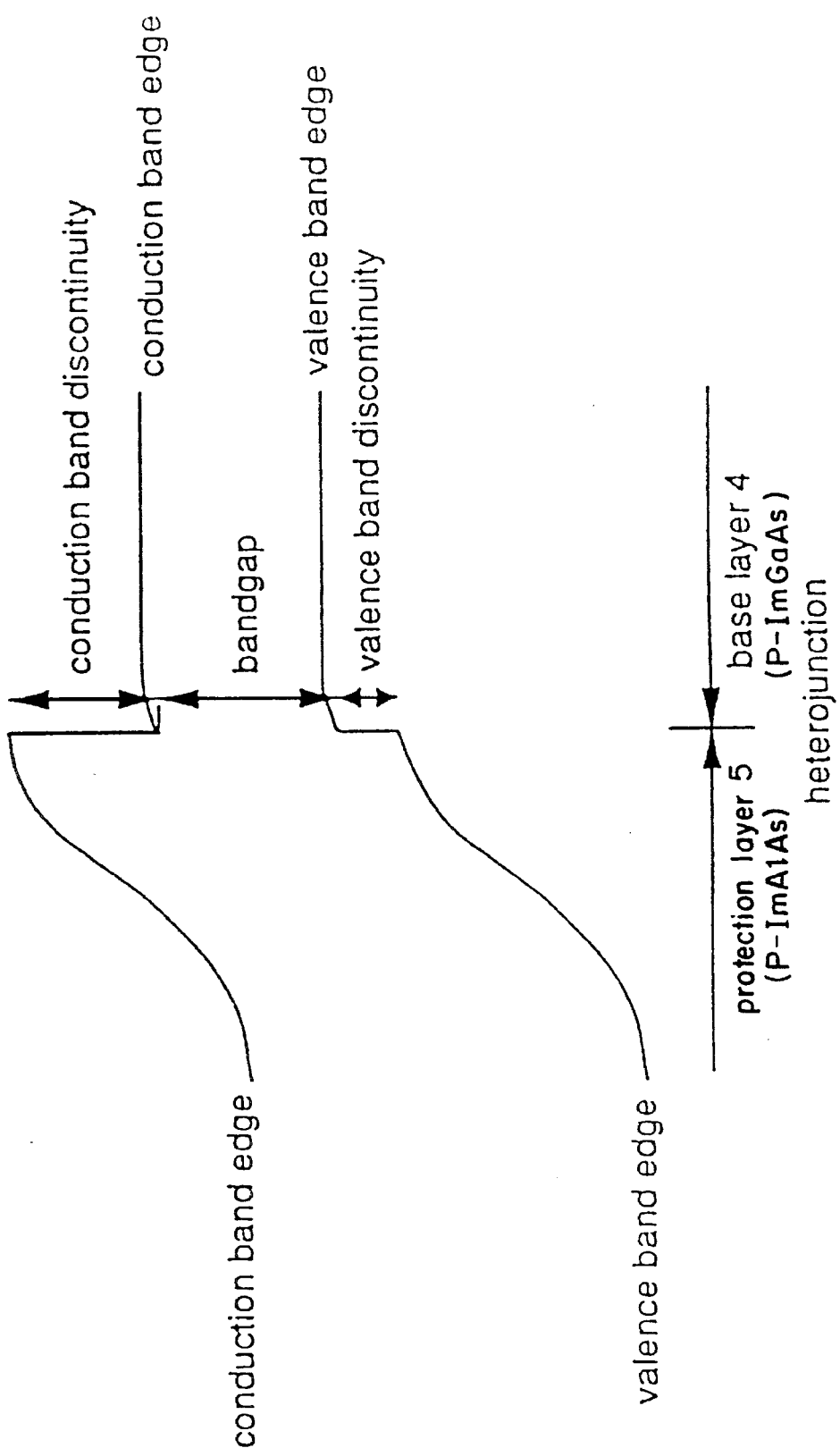

In place of the surface protection layer of InP in the embodiment 1, InAlAs is used as the surface protection layer (In composition ratio is 0.52, and other conditions are the same as those in the embodiment 1). FIGS. 30(*a*) and 30(*b*) respectively show energy band diagrams (both valence and conduction bands) for (1) the hetero-junction between the emitter 6 (of n-InP in this embodiment) and base 4 (of p-InGaAs in this embodiment) and (2) the hetero-junction between the surface protection layer 5 (of p-InAlAs in this embodiment) and the base 4 (of p-InGaAs in this embodiment). As seen in FIGS. 30(*a*) and 30(*b*), there is a difference between InP and InAlAs in the magnitudes of conduction band discontinuity and valence band discontinuity for InGaAs. In the case of InP, the valence band discontinuity is larger, and in the case of InAlAs, the conduction band discontinuity is larger. Because of this, in the present embodiment, the base resistance caused by the contact resistance on the hetero-junction interface is decreased to about two thirds of the value in the case of InP protection layer; therefore, the contact resistance caused by the hetero-junction between the surface protection layer and the base is decreased, and the base resistance is decreased by 25 percent. In the result, the maximum oscillation frequency of 140 GHz is obtained. Moreover, as seen in FIGS. 30(a) and 30(b), the valence band discontinuity between the emitter layer and base is larger than the valence band discontinuity between the surface protection layer and base; and the conduction band discontinuity between the surface protection layer and base is larger than the conduction band discontinuity between the emitter and base.

Embodiment 5

A lamination structure of GaSb/InGaAsSb ($p=4\times10^{19}$/cm$^3$, thickness of each is 0.05 µm) is used for the surface protection layer in place of that of InP in the embodiment 1. Inside the InGaAsSb layer the composition is gradually changed to make Sb composition be zero on the base side and to make As composition be zero on the surface side. In the case of GaSb, the sum of the electron affinity and the forbidden band width is smaller than the work function of an ordinary metal, so that the contact potential of a p-type semiconductor for a metal is very small and an ohmic resistance can be easily obtained. Therefore, the base electrode is made of W alone, and the addition of Zn is stopped. Because of this, irrespective of the length of the period of time of a heating process, the diffusion of the p-type impurities through the base into the collector is stopped, and the yield of elements is remarkably improved.

Embodiment 6

In the present embodiment, a semiinsulator of InP is used as a substrate 1 in place of n-type InP used in the embodiment 1. In this case, the collector electrode cannot be disposed on the back of the substrate, and the electrode shall be stuck on the surface of the substrate. The constitution is shown in FIG. 11.

Figure 12:
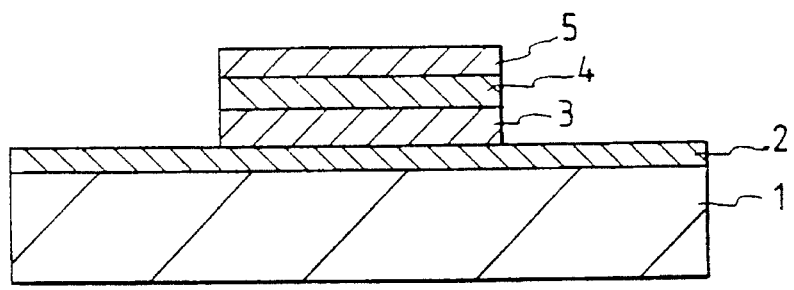
FIGS. 12 and 13 show cross sectional views of a device showing the production process of a bipolar transistor being concerned with the embodiment 6 according to the present invention.

The different points between the embodiment 1 and the present embodiment in the production process are as described below. In the embodiment 1, in the step of the production process to obtain a constitution as shown in FIG. 3, etching depth is adjusted to obtain the constitution as shown in FIG. 12. That is, the sub-collector 2 is left without being etched.

Figure 13:
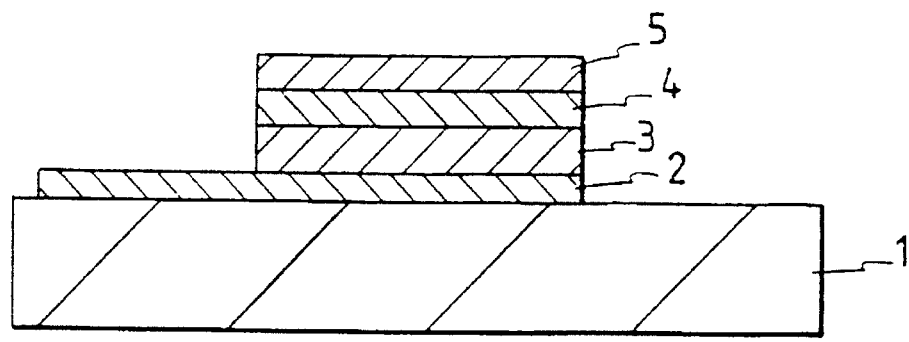

Next, except the area to which the collector electrode is to be stuck, the sub-collector 2 is removed with ordinary photolithography and etching, and then the constitution as shown in FIG. 13 is obtained.

Figure 11:
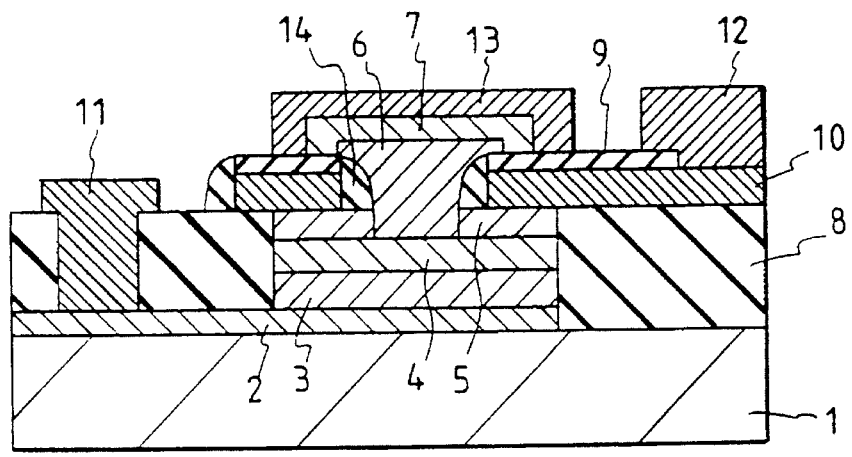
FIG. 11 shows a cross sectional view of a bipolar transistor being concerned with an embodiment 6 according to the present invention.

After that, the steps of production process are advanced in the same way as those in the embodiment 1, and a constitution as shown in FIG. 11 is obtained which has the shape corresponding to that shown in FIG. 10 in the embodiment 1.

After that, an insulating layer is provided over the electrodes and the contact holes for wirings are made, and then metallic wirings are connected to them, and a transistor is completed in the same way as the embodiment 1.

In the present embodiment, a transistor is formed on a semiinsulator substrate, so that a plurality of transistors can be formed in a state that the transistors are separated from each other; such a constitution is suited to form an integrated circuit. On the other hand, the collector is drawn out sideways, so that the facing area of the base electrode and the collector layer becomes large and the capacitance between the base and the collector is increased, which decreases the maximum oscillation frequency by five percent.

Figure 14:
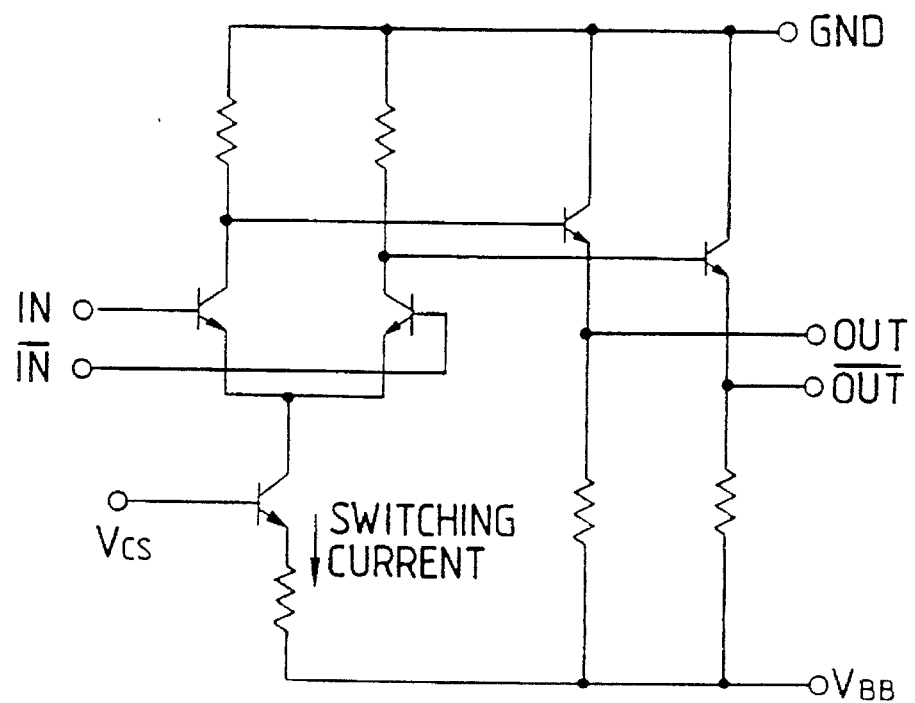
FIG. 14 shows a circuit diagram of an inverter using bipolar transistors according to the present invention.

An inverter circuit as shown in FIG. 14 is constituted using the transistors as described in the present embodiment and the characteristics are investigated.

Figure 15:
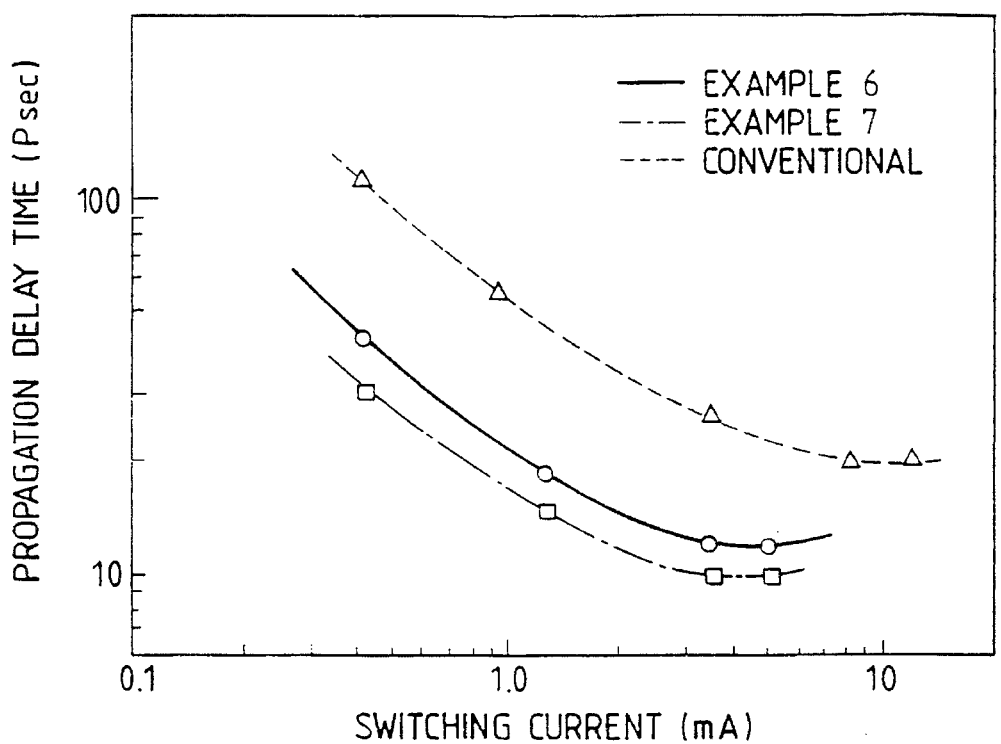
FIG. 15 shows the relation between a delay time and a current of an inverter using bipolar transistors according to the present invention.

The operation of an inverter circuit will be explained in the following. A potential of −3 V for GND is given to VEE and a potential of −2 V for GND is given to VCS, then a transistor $Q_3$ and a resistor $R_3$ constitute a constant current source and a constant switching current flows. When it is assumed that the potential of IN is −0.6 V and the potential of $\overline{IN}$ is −1.1 V, a transistor $Q_1$ is set ON and a transistor $Q_2$ is set OFF, and the switching current flows through the $Q_1$. Then a voltage drop occurs in a resistor $R_1$, but not in a resistor $R_2$, and the potential of a node $N_1$ is lowered than that of $N_2$. As a result, the potential of OUT is lower than that of $\overline{OUT}$. In other words, the potential of OUT is lower than that of $\overline{OUT}$ by making the potential of IN higher than that of $\overline{IN}$; it is the operation of an inverter. The relation between a signal transfer delay time per stage of an inverter circuit and a current which flows through Q1 is shown with a full line in FIG. 15, accordingly. When a similar circuit to the above is constituted with transistors of a conventional constitution, the result corresponding to the above is shown with a broken line in FIG. 15. In comparing both cases, it is clear that in the former case, the power consumption is lower and the operation speed is faster.

The operating conditions of the above-mentioned circuit are described below. The power supply voltage for GRD to be applied to VEE is −3 V, that to be applied to VCS is −2 V, and voltages of −0.6 V and −1.1 V are alternately applied to IN and $\overline{IN}$. When the switching current is to be altered, resistors, $R_1$ and $R_2$, are altered to make the product of the switching current and $R_1$ or $R_2$, be 0.5 V, and the resistors, $R_4$ and $R_5$, are altered to make the current which flow through the transistors, $Q_4$ and $Q_5$, be 1 to 1.5 times of the switching current.

Because of this, it is shown that a transistor according to the present invention is suited to be used for a logic circuit which requires high-speed operation and low power consumption.

Figure 16:
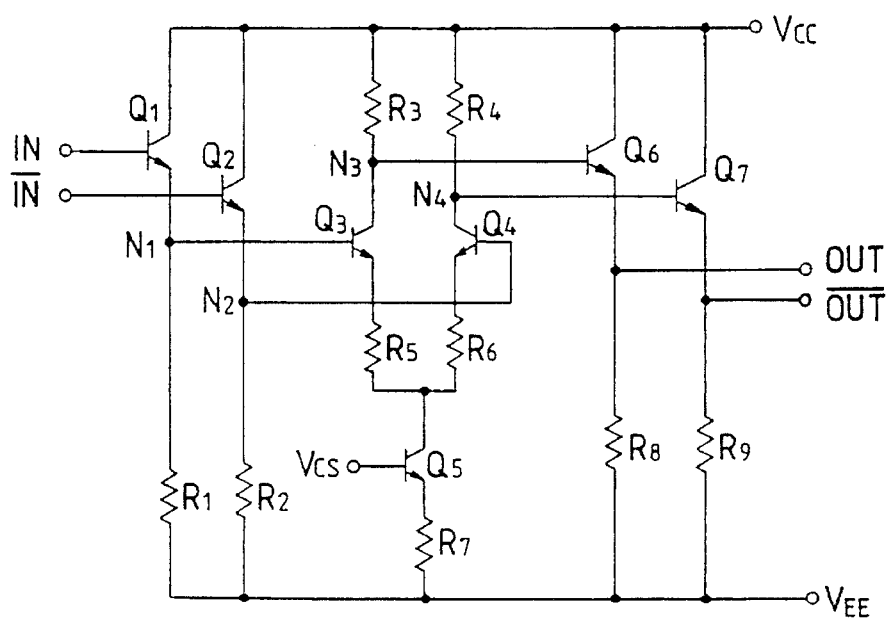
FIG. 16 shows a circuit diagram of a differential amplifier using bipolar transistors according to the present invention.

An emitter coupled differential amplifier circuit as shown in FIG. 16 is constituted using transistors shown in the present embodiment, and the characteristics are investigated.

The operation of a differential amplifier is as described in the following. The transistors, $Q_1$ and $Q_2$, and resistors, $R_1$ and $R_2$, constitute an input buffer circuit of an emitter follower type, and it increases the input resistance. The transistors, $Q_3$, $Q_4$ and $Q_5$, and resistors, $R_3$ to $R_7$, constitute a differential amplifying stage. The operation is likely to that of the inverter circuit described in the preceding embodiment, and the $Q_5$ and the $R_7$ constitute a constant current source. The sum of currents which flow through the transistors, $Q_3$ and $Q_4$, is equal to the current of the above-mentioned constant current source, so that when the current of the $Q_3$ increases, the current of the $Q_4$ decreases. Therefore, the potentials of a node $N_3$ and a node $N_4$ are changed in the opposite phase. The transistors, $Q_6$ and $Q_7$, and resistors, $R_8$ and $R_9$ constitute an output buffer circuit which decreases the output resistance. The amplification factor of the amplifier is approximately equal to the ratio of $R_3$ and $R_5$ or to the ratio of $R_4$ and $R_7$. In the above circuit, the current which flow through the transistors, $Q_1$, $Q_2$, $Q_5$, $Q_6$ and $Q_7$, is 5 mA, VCC is 0 V, VEE is −5 V, VCS is −4 V, $R_5$ and $R_6$ are 30 Ω, and $R_3$ and $R_4$ are 400 Ω. When the circuit amplification factor is equal to zero, the band width of the amplifier is 15 GHz. When the band width is compared with the band width of six GHz of an amplifier constituted with transistors of a conventional constitution, it is clear that the band width of the amplifier in the present embodiment is wider than that of a conventional one.

As described in the above, it is clearly shown that a transistor according to the present invention is suited to constitute a wide band amplifier.

Embodiment 7

A hetero-junction bipolar transistor is manufactured using the production step to decide the junction area of the base and the collector in a self-aligning manner used in a step of production process in the embodiment 6.

Figure 17:
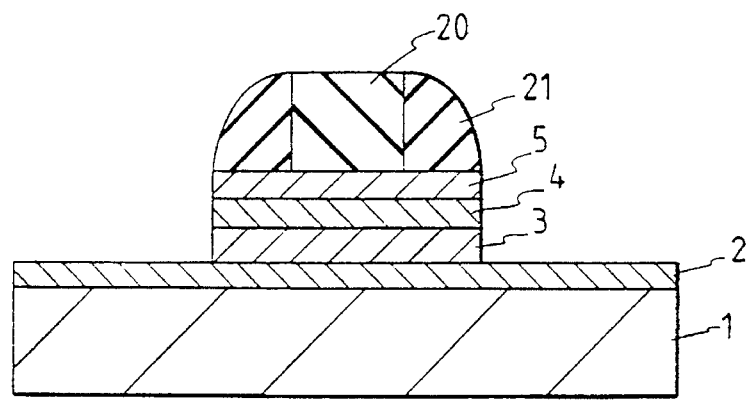
FIGS. 17 to 23 show cross sectional views of a device showing the production process of a bipolar transistor being concerned with an embodiment 7 according to the present invention.

In the production process of the present embodiment, different points from that in the embodiment 6 are shown in the following. At first, an $SiO_2$ film is deposited on a crystal having a constitution as shown in FIG. 2, and a dummy emitter 20 is formed by ordinary photolithography and etching. Next, the deposition of silicon nitride (SIN) is performed and anisotropic etching on the whole surface is performed to leave a side wall 21. After that, the layer except the part of the sub-collector 2 is removed in the same manner as in the embodiment 6 to obtain a constitution as shown in FIG. 17.

Figure 18:
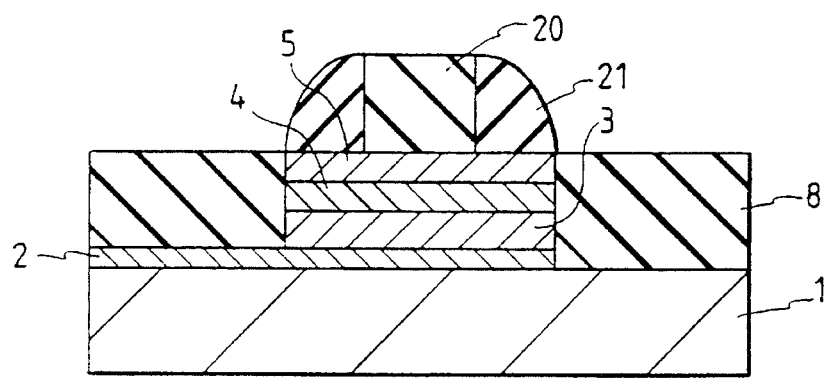

Next, the area of a sub-collector 2 except the part on which a collector electrode is to be stuck is removed by ordinary photolithography and etching, and a burying insulator layer 8 is formed up to the surface of a semiconductor to obtain a constitution as shown in FIG. 18.

Figure 19:
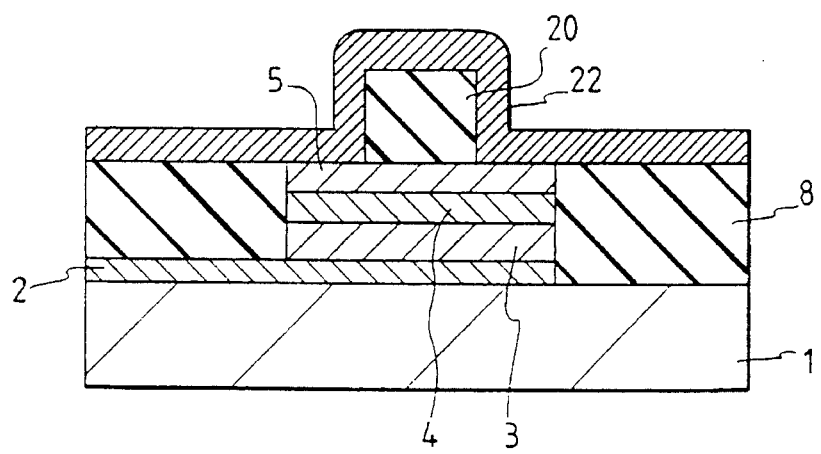
Figure 20:
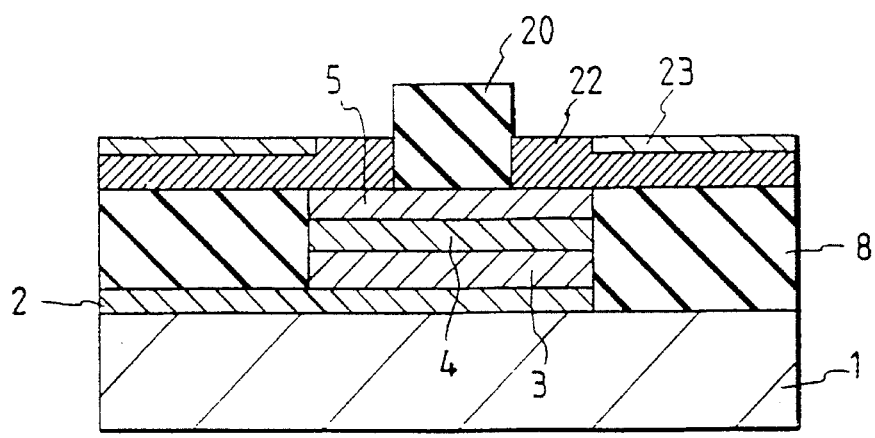

Next, the side wall 21 is removed, and a base leadout electrode 22 is deposited on the whole surface to obtain a constitution as shown in FIG. 19. After the deposition of a planed layer 23, it is planed, and the dummy emitter 20 is exposed as shown in FIG. 20 in the same manner as that in the embodiment 1.

Figure 21:
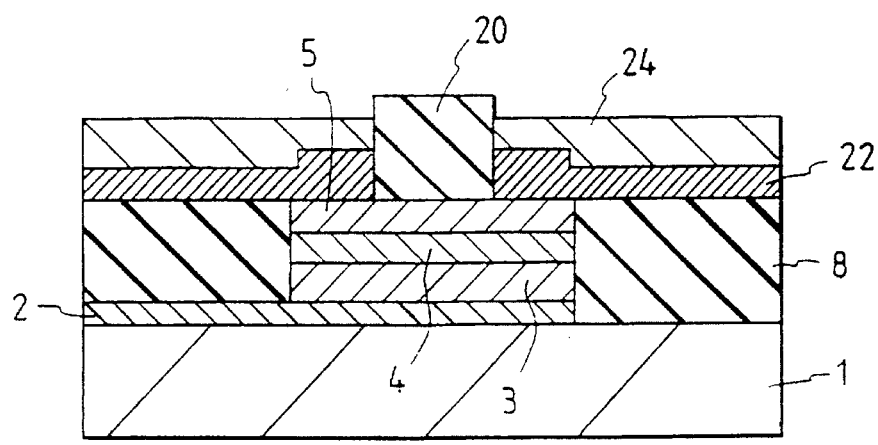

Following this, an insulating layer 24 is deposited and planarized to obtain a constitution as shown in FIG. 21.

Figure 22:
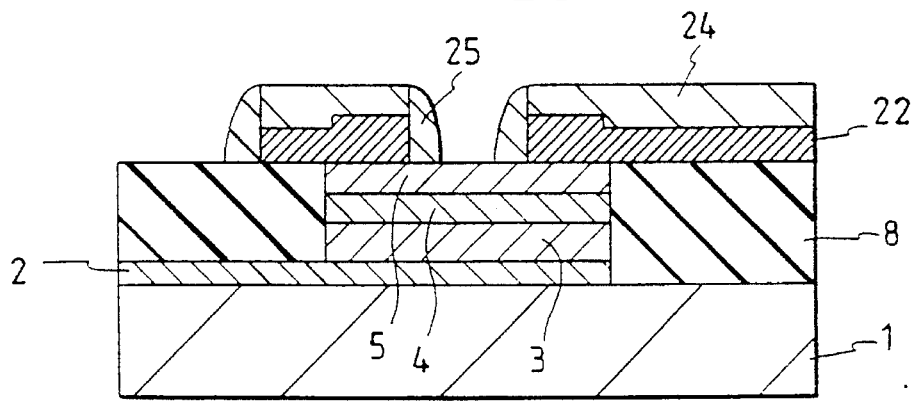
Figure 23:
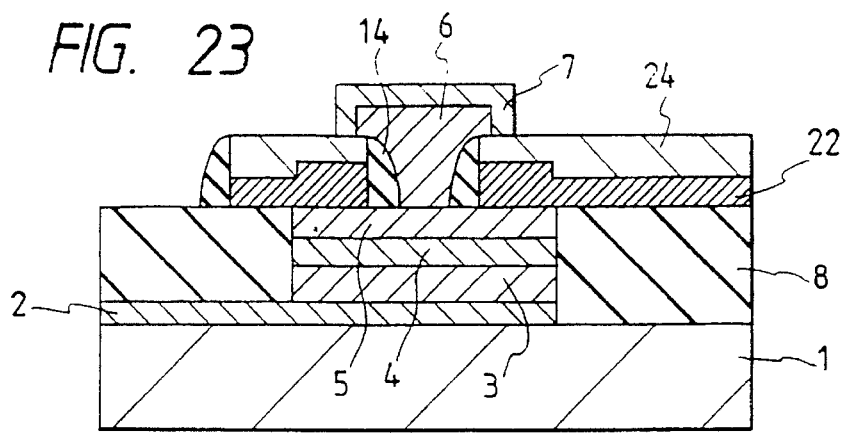
Figure 24:
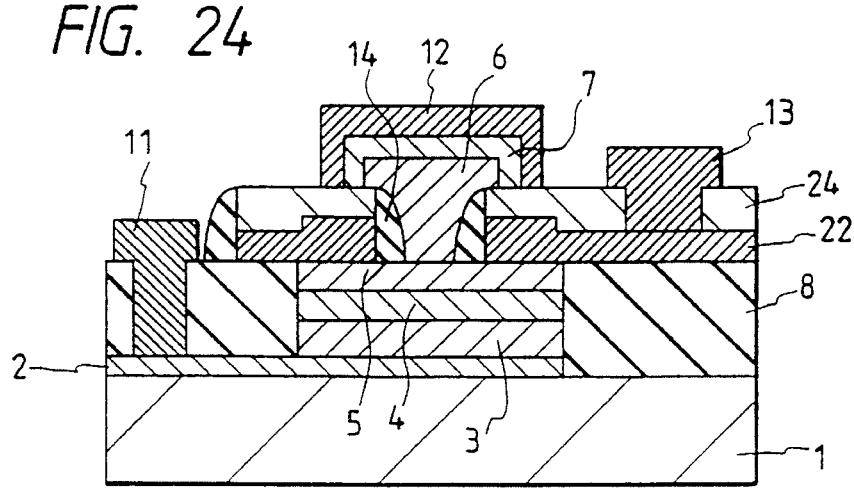
FIG. 24 shows a cross sectional view of a bipolar transistor being concerned with the embodiment 7 according to the present invention.

After that, removal of the dummy emitter 20, processing of a base leadout electrode 22, forming of a side wall 25 (in FIG. 22), forming of the emitter 6 by selective growth, forming of the cap 7, and fixing of electrodes 12, 13 and 11 of the emitter, the base and the collector (in FIG. 24) are performed, and an insulating layer (not shown in a drawing) is further provided on the electrodes and contact holes for the connection with wirings are worked on the insulating layer and metallic wirings are fixed, then a transistor is completed in the same way as in the embodiment 1.

In the present embodiment, the junction area of the base and the collector is defined in a self-aligning manner with the dummy emitter using a side wall process, and there is no need to have a tolerance for alignment for photolithography. Owing to this, the junction area of the base and the collector can be miniaturized down to 1.8×4.3 $\mu m^2$, while the junction area of the emitter and the base is 1×3.5 $\mu m^2$. As a result, the capacitance between the base and the collector is decreased down to 3.5 femtofarad and the maximum oscillation frequency of 150 GHz is obtained.

An inverter circuit as shown in FIG. 14 is formed using the transistors shown in the present embodiment, and the characteristics are investigated. The relation between a signal transfer delay time per stage of the inverter circuit and a current which flows through the transistor Q1 is shown by a one-dot chain line in FIG. 15. When a similar circuit is constituted with transistors of a conventional constitution, the corresponding result is shown by a two-dot chain line in the figure, and when these two cases are compared it is clear that the circuit in the former case shows the performance of low power consumption and high operation speed.

Thus, it is shown that the transistor according to the present invention is suited to a logic circuit in which high-speed and low power consumption are required.

An emitter coupled type differential amplifier circuit is constituted using the transistors which are shown in the present embodiment, and the characteristics are investigated. The result shows that the band width of the amplifier is 18 GHz when the circuit amplification factor is adjusted to be ten. It is clear that the circuit has wider band width in comparison with the band width of 6 GHz of an amplifier constituted with transistors of a conventional constitution.

As described in the above, it is shown that the transistor according to the present invention is suited to be used in a wide band amplifier circuit.

Embodiment 8

Figure 25:
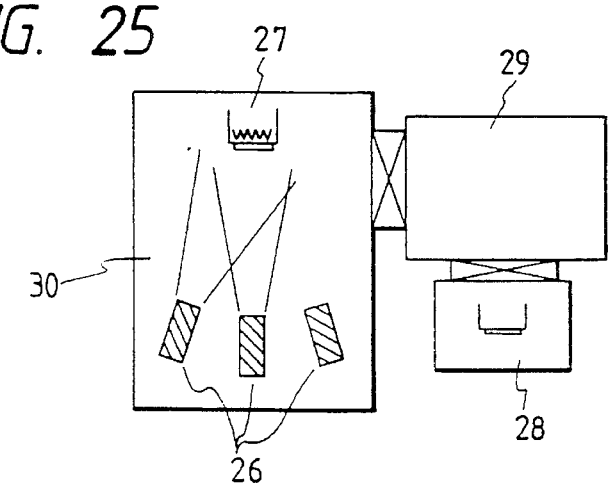
FIG. 25 shows a multiple-chamber for etching and crystal growth to be used for the production of a semiconductor device according to the present invention.
Figure 26:
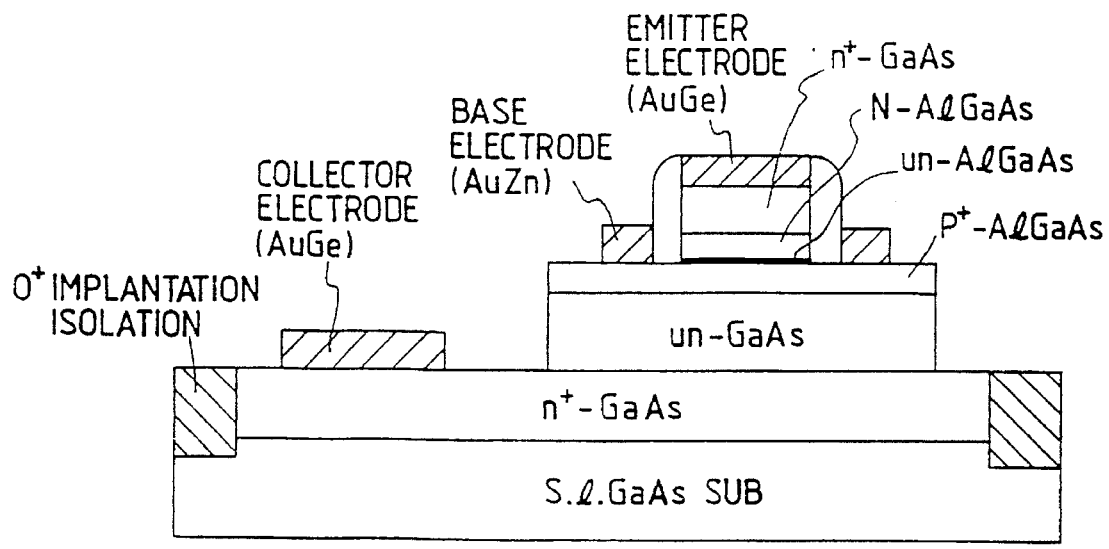
FIG. 26 shows a cross sectional view of a conventional hetero-bipolar transistor.
Figure 27:
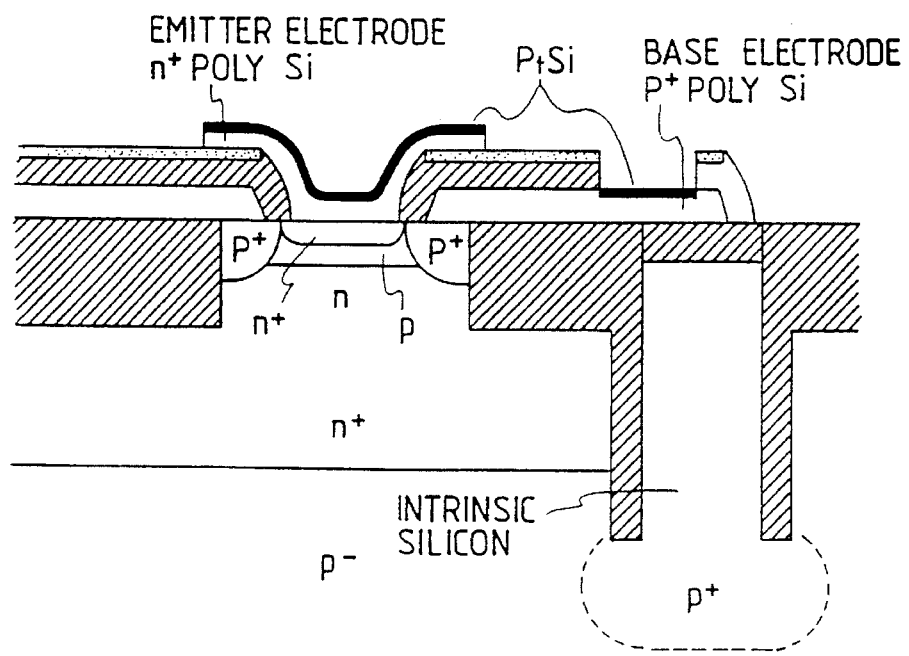
FIG. 27 shows a cross sectional view of another conventional bipolar transistor.

In the present embodiment, AlGaAs ($p=4\times10^{19}/cm^3$, thickness: 0.05 μm, and Al composition ratio: ranged between 0.01 and 0.1) is used as the base layer 4 in the embodiment 2. At first, the surface protection layer shown in FIG. 7 is etched in the air and after that crystals are grown in a selective crystal growth device. Because of the high recombination level on the interface between the emitter and the base, the maximum value of the current amplification factor is lowered to smaller than ten. Then, etching is performed in heating the substrate up to 250° C. in the atmosphere of chlorine gas using a device shown in FIG. 25, and after that the device is evacuated and the work is transferred to a crystal growth chamber without touching the air and selective growth is performed. In the figure, a numeral 26 denotes a gas source cell, 27 denotes an MOMBE chamber, 28 denotes an etching chamber and 29 denotes a vacuum transfer mechanism. In the result, a current amplification factor of more than 50 is obtained with good reproducibility.

Owing to the present invention, the emitter resistance of a bipolar type semiconductor is decreased. The contact area between an emitter electrode and an emitter can be made larger than the contact area between the emitter and the base; thereby, the resistance caused by the junction with an electrode is decreased. It is also made possible to miniaturize a transistor to a size of two thirds of that of a conventional one with a miniaturizing technique of the same order as a conventional technique.

It is further understood by those skilled in the art that the foregoing description describes preferred embodiments of the disclosed device and that various changes and modifications may be made in the invention without departing from the spirit and the scope thereof.

What is claimed is:

1. A hetero-junction bipolar transistor comprising:
    a collector layer, composed of a single crystalline compound semiconductor having a first conductivity type;
    a base layer composed of a single crystalline compound semiconductor having a second conductivity type opposite to said first conductivity type, formed on said collector layer;
    a surface protection layer, composed of a single crystalline compound semiconductor formed on said base layer, having an opening to expose part of said base layer, and having a wider forbidden band width than that of said base layer;

an emitter layer, formed on said base layer within said opening, an upper surface of the emitter layer having a larger area than that of a lower surface of the emitter layer, the emitter layer being composed of a single crystalline compound semiconductor of said first conductivity type and having a wider forbidden band width than that of said base layer;

an emitter electrode, having a larger area than that of said lower surface of said emitter layer, and being electrically connected to said upper surface of said emitter layer;

a base electrode electrically connected to said base layer; and a collector electrode electrically connected to said collector layer.

2. A hetero-junction bipolar transistor designated in claim 1, further comprising:

a base leadout electrode formed on an upper surface of said surface protection layer;

a first insulating film formed on said base leadout electrode; and a second insulating film formed on an inside wall of said base leadout electrode and said first insulating film.

3. A hetero-junction bipolar transistor designated in claim 2, wherein a first junction between said collector layer and said base layer has a larger area than that of a second junction between said base layer and said emitter layer, wherein said surface protection layer has said second conductivity type, and wherein said base electrode is formed on an upper surface of said surface protection layer.

4. A hetero-junction bipolar transistor designated in claim 3, wherein said collector layer is disposed on a substrate composed of a single crystalline compound semiconductor.

5. A hetero-junction bipolar transistor designated in claim 4, wherein a collector electrode is disposed on a rear surface of said substrate, said collector layer being disposed on a front surface of the substrate, opposite to the rear surface.

* * * * *